United States Patent
de Gruijl

(10) Patent No.: US 8,339,157 B2
(45) Date of Patent: Dec. 25, 2012

(54) METHODS, CIRCUITS, SYSTEMS AND ARRANGEMENTS FOR UNDRIVEN OR DRIVEN PINS

(75) Inventor: Robert de Gruijl, San Francisco, CA (US)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 12/922,661

(22) PCT Filed: Mar. 16, 2009

(86) PCT No.: PCT/IB2009/051079
§ 371 (c)(1),
(2), (4) Date: Sep. 14, 2010

(87) PCT Pub. No.: WO2009/115979
PCT Pub. Date: Sep. 24, 2009

(65) Prior Publication Data
US 2011/0006808 A1    Jan. 13, 2011

Related U.S. Application Data

(60) Provisional application No. 61/036,964, filed on Mar. 16, 2008.

(51) Int. Cl.
*H03K 19/00* (2006.01)
*H03K 19/0175* (2006.01)

(52) U.S. Cl. ............................ 326/56; 326/82; 326/86

(58) Field of Classification Search ............ 326/26, 326/30, 82–87, 56, 37–41, 47, 101
See application file for complete search history.

(56) References Cited

U.S. PATENT DOCUMENTS

| | | | |
|---|---|---|---|
| 5,594,362 A | 1/1997 | Owen | |
| 5,684,411 A * | 11/1997 | Nepple | 326/38 |
| 5,754,480 A | 5/1998 | Sato | |
| 6,335,648 B1 * | 1/2002 | Matsushita | 327/198 |
| 6,717,865 B2 * | 4/2004 | Laurent | 365/189.06 |
| 6,777,986 B2 * | 8/2004 | Hidaka et al. | 327/108 |
| 6,870,400 B1 * | 3/2005 | Chong et al. | 326/82 |
| 7,119,579 B2 * | 10/2006 | Chong et al. | 326/82 |
| 7,250,796 B2 * | 7/2007 | Hidaka et al. | 327/112 |
| 7,259,591 B1 * | 8/2007 | Brown | 326/82 |
| 2004/0212398 A1 | 10/2004 | Kitazawa et al. | |
| 2004/0232942 A1 * | 11/2004 | Kundu et al. | 326/39 |
| 2005/0253626 A1 * | 11/2005 | Chong et al. | 326/82 |
| 2007/0205804 A1 | 9/2007 | Brown | |
| 2008/0225610 A1 * | 9/2008 | Kang | 365/189.11 |
| 2009/0002018 A1 * | 1/2009 | Jeong et al. | 326/30 |

FOREIGN PATENT DOCUMENTS

| EP | 0 513 663 A1 | 11/1992 |
|---|---|---|
| EP | 0 726 653 A1 | 8/1996 |

OTHER PUBLICATIONS

International Search Report and Written Opinion for Int'l. patent appln. No. PCT/IB2009/051079 (Jul. 8, 2009).

* cited by examiner

*Primary Examiner* — Thienvu Tran

(57) ABSTRACT

Input/Output (I/O) pin circuits, devices, methods and systems are implemented in various fashions. According to one such method, a valid signal level is provided for a pin of an integrated circuit (IC) die. Responsive to a reset signal, a first mode (304) is entered where one of a pull-up circuit or pull-down circuit is enabled (308, 310) to set the pin to the valid signal level. A change in signal level of the pin that is a deviation from the valid signal level is detected (312). Responsive to detecting the change, a second mode (314) is entered where the one of a pull-up circuit or pull-down circuit is disabled (316).

20 Claims, 4 Drawing Sheets

METHODS, CIRCUITS, SYSTEMS AND ARRANGEMENTS FOR UNDRIVEN OR DRIVEN PINS

The present invention relates generally to input/output pins, and more specifically, to dynamic pull-up or pull-downs for input/output pins.

Integrated circuits (ICs) are continually increasing in their complexity. In addition to added functionality, ICs sometimes consolidate functionality from several ICs into a single IC. In addition to increasing processing power within an IC, an important factor is often the communication bandwidth between an IC and other components in the system. For example, increased processing power (and increased functionality) often results in a need for more data throughput to and from the IC (e.g., to provide sufficient data for the increased processing power). In one instance, the communication bandwidth can be increased using faster serial data rates and/or more parallel data lines. Thus, increasing the complexity of an IC often results in an increase in the number of input/output pins. This can lead to increased power draw from the input/output pins. Moreover, integrated circuits are sometimes used in environments with limited power constraints. These and other factors are often at odds with desires to increase the complexity of ICs and offer a backdrop for many of the problems seen in IC development efforts.

Often the input/output pins use a pull-up and/or pull-down to ensure that a particular pin is set to a valid signal level even when not driven externally. This would include an input pin that was not driven or a bi-directional pin that was not active (e.g., a three-state output in high-impedance mode). These pull-ups/downs can be implemented in a number of different manners including, but not limited to, an input cell contained within the IC or an external element (e.g., a resistor tied to a valid signal level). When active, pull-up/down circuits dissipate power. The power dissipation can be particularly large for situations where the pin is driven to a substantially different voltage level relative to the pull-up/down voltage level. For example, if the pull-up/down is implemented using a resistor, the dissipated power for each pin is commensurate with the difference between the pull-up/down voltage level and the driven voltage level. For a large number of input/output (I/O) pins, such dissipated power can be substantial. Moreover, the presence of a pull-up/down may slow some signal transitions. This may require an increase in the strength of the driver and might not only result in increased power draw, but worsened voltage supply drops. For example, local voltage supply levels can be lowered due to current draw from a near simultaneous transition of a number of pins. Such transitions can be relatively common for pins of a common data bus.

Various aspects of the present invention are directed to methods, systems, circuits and arrangements for implementing dynamically controlled pull-ups or pull-downs on input/output (I/O) pins of IC die. One of a pull-up or a pull-down is enabled on the I/O pins. Upon sensing that the pin is being driven, the pull-up or pull-down is disabled. This can be particularly useful for reducing the power consumption of the IC die and/or the system in general. For example, embodiments of the present invention can be useful for disabling unnecessary pull-up and/or pulls-downs without the use of external components.

Consistent with another example embodiment, a method provides a valid signal level for a pin of an integrated circuit (IC) die. Responsive to a reset signal, a first mode is entered where one of a pull-up circuit or pull-down circuit is enabled to set the pin to the valid signal level. A change in signal level of the pin, such as a deviation from the valid signal level, is detected. Responsive to detecting the change, a second mode is entered where the pull-up/down is disabled.

Consistent with another example embodiment, a circuit provides a valid signal level for a pin of an integrated circuit (IC) die. When enabled, one of a pull-up circuit or a pull-down circuit is able to set the pin to the valid signal level. An enabling circuit is provided. The enabling circuit enables either the pull-up circuit or the pull-down circuit in response to a reset signal. The enabling circuit also disables the enabled pull-up/down circuit in response to a change from the valid signal level at the pin.

Consistent with another example embodiment, a system is implemented with an integrated circuit (IC) die. Within the IC die are a variety of components. A pin connects signals external to the IC die with signals internal to the IC die. Either a pull-up circuit or pull-down circuit sets the pin to the valid signal level when enabled. An enabling circuit enables the pull-up/down circuit in response to a reset signal. The enabling circuit also disables the pull-up/down circuit in response to the pin changing from the valid signal level.

The above summary is not intended to describe each embodiment or every implementation of the present disclosure. The figures and detailed description that follow more particularly exemplify various embodiments.

The invention may be more completely understood in consideration of the following detailed description of various embodiments of the invention in connection with the accompanying drawings, in which.

Figure 1:
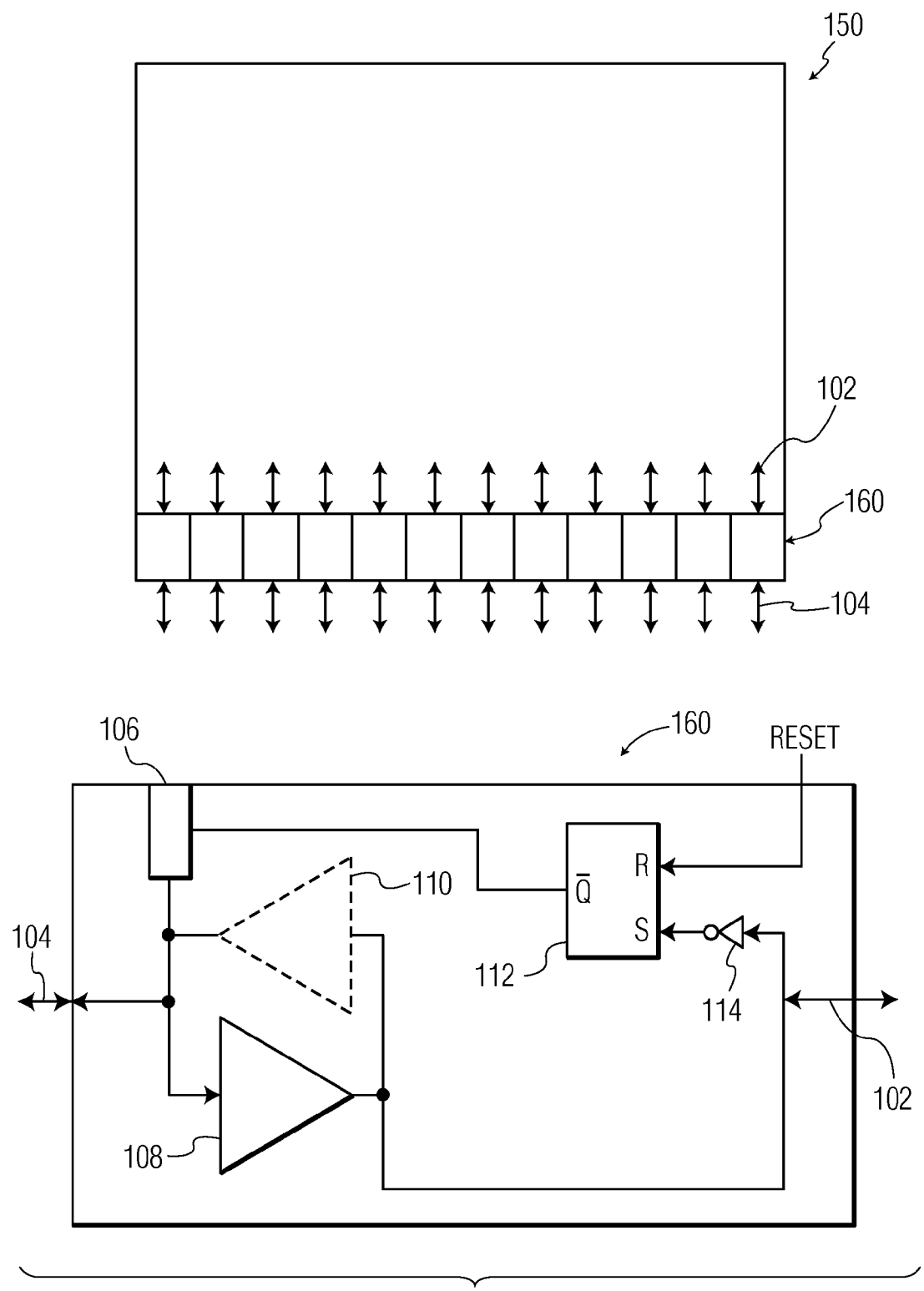
FIG. 1 shows a circuit diagram for an IC die having dynamic pull-ups/downs for I/O pins, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

The present invention is believed to be applicable to a variety of different types of processes, devices and arrangements for use with communication pins of an integrate circuit (IC) die, and in particular, to approaches for dynamic pull-ups/downs. While the present invention is not necessarily so limited, various aspects of the invention may be appreciated through a discussion of examples using this context.

Embodiments of the present invention relate to a method for implementing dynamically controlled pull-ups or pull-downs on input/output (I/O) pins of an IC die. As used herein, unless otherwise stated, I/O pin is used to denote any of an input pin or a bidirectional (input and output) pin. By default either a pull-up or a pull-down is enabled on the I/O pins. Upon sensing that the pin is being driven, the pull-up or pull-down is disabled. This can be particularly useful for reducing the power consumption of the IC die and/or the system in general.

In a specific embodiment, the pull-up or pull-down remains disabled until reset by a signal. For example, the system can generate a reset signal upon startup. This enables the pull-ups and/or pull-downs on the I/O pins. After initialization, the system can assume normal operation. As signals are driven on the I/O pins, the pull-ups on those I/O pins are disabled. This results in the pull-ups and pull-downs for actively driven I/O pins being disabled over time (e.g., as they are driven/used), while the pull-ups and pull-downs for those I/O pins that are not actively driven remain enabled.

The various signals discussed herein can be implemented in a variety of manners including either active high or active low. For simplicity, such aspects of the signals are not mentioned for each instance. The invention, however, should not be so limited.

FIG. 1 shows a circuit diagram for an IC die having dynamic pull-ups/downs for I/O pins, according to an example embodiment of the present invention. IC die 150 includes a plurality of I/O pins, including I/O pin 160. I/O pin 160 communicatively couples internal data line 102 to external data line 104. External data line 104 is desired to be maintained at a valid signal level, even where it is otherwise unused. Pull-up/down element 106, when enabled and not overdriven, sets data line 104 to a valid signal level. Buffer/driver 108 formats the signal to generate signal 102. Signal 102 can then, if so desired, be used within the IC die. Optionally, I/O pin 160 can be a bi-directional pin that is driven by buffer/driver 110.

When I/O pin 160 is initialized by the reset signal, SR latch 112 is set. Once set the SR latch 112 output enables pull-up/down 106. The SR latch maintains the enablement of pull-up/down 106 until the signal is driven. If pull-up/down element 106 is a pull-up, inverter 114 can be implemented. If pull-up/down element 106 is a pull-down, inverter 114 can be removed. Alternatively, a different SR latch configuration can be used, such as the configuration shown in connection with the pull-down of FIG. 2. In this manner, SR latch 112 detects a change in the signal level. In particular, SR latch 112 is reset when signal 104 is driven to a level that is opposite of the signal level of pull-up/down element 106. Once pull-up/down element 106 is disabled, it remains disabled until a reset pulse is provided.

A reset pulse can be provided at any point. In a first instance, a reset pulse is provided only once (e.g., upon power-up of the IC die). In another instance, a reset pulse is provided at anytime during which the I/O interface has the potential to change. For example, the reset pulse can be provided after power-up/initialization in response to an external device being disabled. External devices can be disabled for any number of reasons including, but not limited to, changes in operating (e.g., power-saving) modes or physical removal (or addition) of a device. Another instance involves the application of a reset pulse in response to detecting corrupted data or spurious data on one or more pins. In yet another instance, the reset can be periodically provided. While such periodic reset pulses could result in increased power draw relative to a single reset pulse, the periodic reset could correct for incorrectly disabled pull-up/down elements that could otherwise accumulate overtime.

Figure 2:
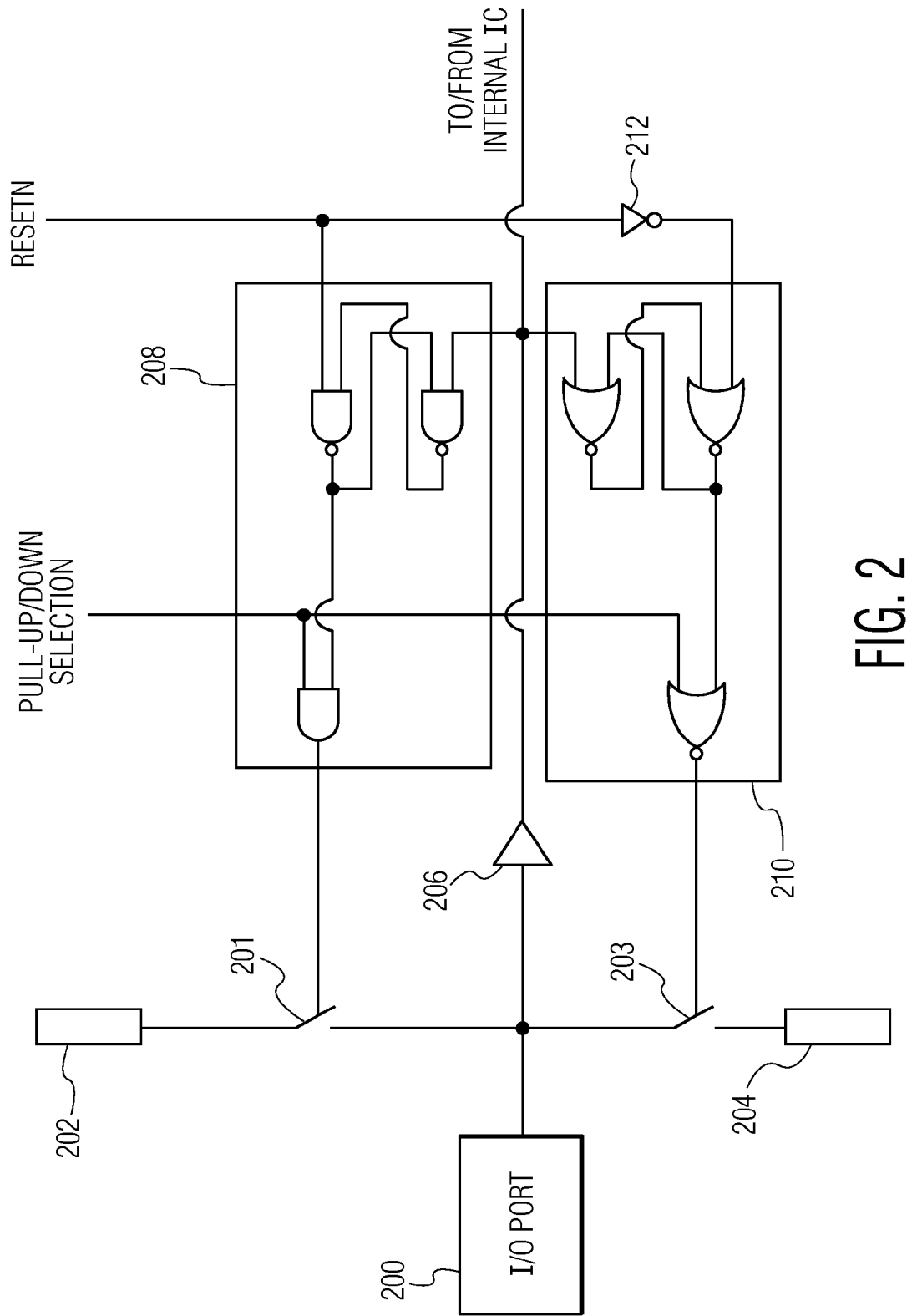
FIG. 2 shows a circuit for providing dynamic pull-up and pull-down control, according to an example embodiment of the present invention.

FIG. 2 shows a circuit for providing dynamic pull-up and pull-down control, according to an example embodiment of the present invention. I/O pin 200 connects to an external pin of the IC. Pull-up 202 and pull-down 204 are connected to a high and low voltage, respectively. Switches 201 and 203 connect (and disconnect) pull-up 202 and pull-down 204, respectively, to I/O pin 200. Input buffer 206 buffers the signal from I/O pin 200. Logic blocks 208 and 210 control switches 201 and 203, respectively. Logic blocks 208 and 210 each have inputs for pull-up/down selection, reset and the current state of I/O pin 200. The pull-up/down selection signal allows for flexible selection of either a pull-up or a pull-down implementation for I/O pin 200. The logic also ensures that only one of the pull-up 202 or pull-down 204 is enabled at any one time.

The resetn signal places both logic blocks 208 and 210 in a state to enable respective pull-up 202 or pull-down 204, as further conditioned upon the pull-up/down selection signal. Once the resetn signal has been removed, the enabled pull-up/down remains enabled until a change in signal value of I/O pin 200 is detected. In particular, logic block 208 detects a transition (on I/O pin 200) from a pull-up signal value to a low signal value. Upon such detection, the enable signal sent to switch 201 is removed so as to disable pull-up 202. Alternatively, logic block 210 detects a transition (on I/O pin 200) from a pull-down signal value to a high signal value. Upon such detection, the enable signal sent to switch 203 is removed so as to disable pull-down 204. Once either pull-up/down is disabled, the appropriate logic block maintains the disabled state until a reset pulse is received.

Table 1 shows an example logic function for such a circuit.

TABLE 1

| PU/PD | Resetn | I/O Pin | PU-Enable | PD-Enable |
|---|---|---|---|---|
| 0 | 0 | X | 0 | 1 |
| 1 | 0 | X | 1 | 0 |
| 0 | 1 | 0 | 0 | Maintain State |
| 0 | 1 | 0 -> 1 | 0 | 0 |
| 1 | 1 | 1 | Maintain State | 0 |
| 1 | 1 | 1 -> 0 | 0 | 0 |

As shown in Table 1, a resetn (active low) pulse enables the appropriate pull-up or pull-down. Once enabled, the I/O pin state should settle to the corresponding pull-up/down value unless otherwise driven. Thereafter, Table 1 shows the selected PU/PD as maintaining state. Thus, after the resetn is removed the selected pull-up/down will maintain the current (enabled) state so long as the I/O pin is not driven to a different value. If the signal level changes (0->1, for pull-down; 1->0, for pull-up), then the selected pull-up/down is disabled. After such a state, Table 1 shows that the selected pull-up/down will remain disabled (i.e., either disabled or maintain current (disabled) state) unless a reset is received.

The pull-up/down selection signal can be implemented in various manners. In one instance, a register (or registers) contains a pull-up or down setting that determines the status of the PU/PD signal provided to one or more pins. This register setting can be, among other things, loaded from a non-volatile memory (e.g., at startup), part of an initialization process or program, or set using external logic or configuration pin(s). In another instance, the particular pull-up or pull-down setting can be hard-coded into the logic of the IC. This can be useful, for example, where certain pins have predetermined functionality. In yet another instance, the IC can be initialized according to a first default setting for the pull-up and pull-downs. Thereafter the IC can be reinitialized (e.g., using an internal or external configuration protocol). An example re-initialization protocol can be implemented by setting pull-up/down register(s) and triggering the resetn signal to the appropriate pins.

The skilled artisan would recognize the specific logic implementation shown in the various figures is merely representative of one example that provides similar functionality. As such, various changes to the circuit are envisioned without departing from the spirit of the invention. For example, the logic can be modified to account for inverted input signals and/or inverted active switch enables. Other examples include, but are not limited to, latches other than SR latches (e.g., clocked (D) flip-flops or gated SR latches) and combinations of discrete components providing similar functionality.

Figure 3:
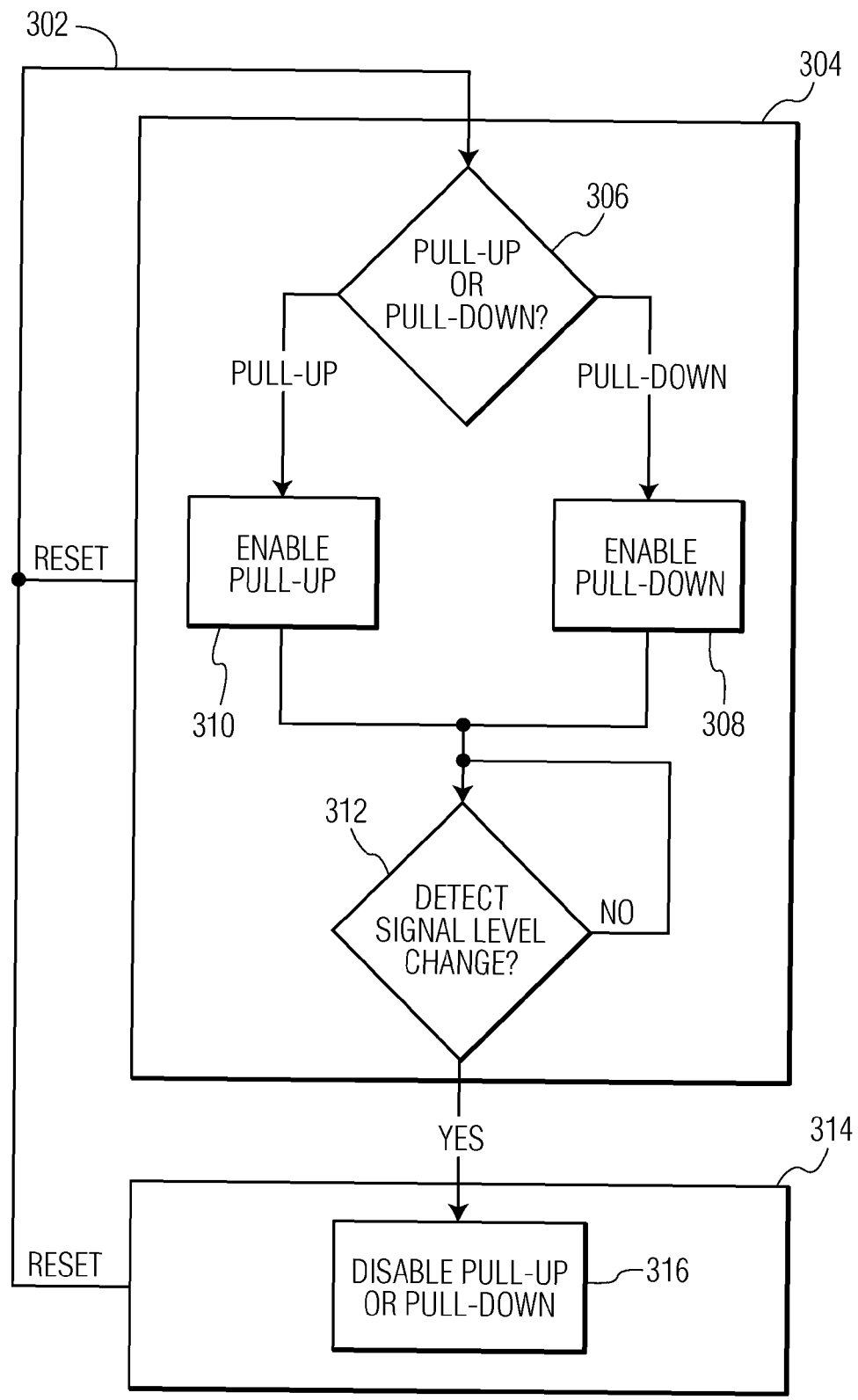
FIG. 3 shows a flow diagram that is consistent with a method for providing dynamic pull-up or pull-down functionality on an I/O pin, according to an example embodiment of the present invention.

FIG. 3 shows a flow diagram that is consistent with a method for providing dynamic pull-up or pull-down functionality on an I/O pin, according to an example embodiment of the present invention. Should a reset 302 be received, at any point, the system enters mode 304. In mode 304, decision block 306 represents a selection of a pull-up or a pull-down for the I/O pin. The selected pull-up or pull-down is enabled at steps 310 and 308, respectively. The enable steps 308 or 310 each implies that the alternative/non-selected pull-up or pull-down is disabled. Mode 304 is maintained, along with the enabled/disabled pull-up and pull-down settings until a signal level change is detected at decision block 312. The signal level change is indicative of the pin being driven.

Mode 314 is entered in response to the detection of decision block 312. In mode 314, the enabled pull-up or pull-down (from enable step 308 or 310) is disabled. This results in both the pull-up and the pull-down being disabled. Mode 314 is maintained (along with the disabled pull-up/down) until a reset is received.

It should be noted that the flow diagram shown in FIG. 3 is merely representative of one embodiment of the present invention. The present invention is not so limited and can include various modifications or additions to the flow diagram. As a non-limiting example, the selection of a pull-up or pull-down at step 306 can be removed for a pin that only requires one of a pull-up or pull-down. While such an implementation might reduce the flexibility of the pin to provide both a pull-up and a pull-down, such a change can be useful to simplify the logic and possibly to reduce the area and/or power requirements of the system.

Figure 4:
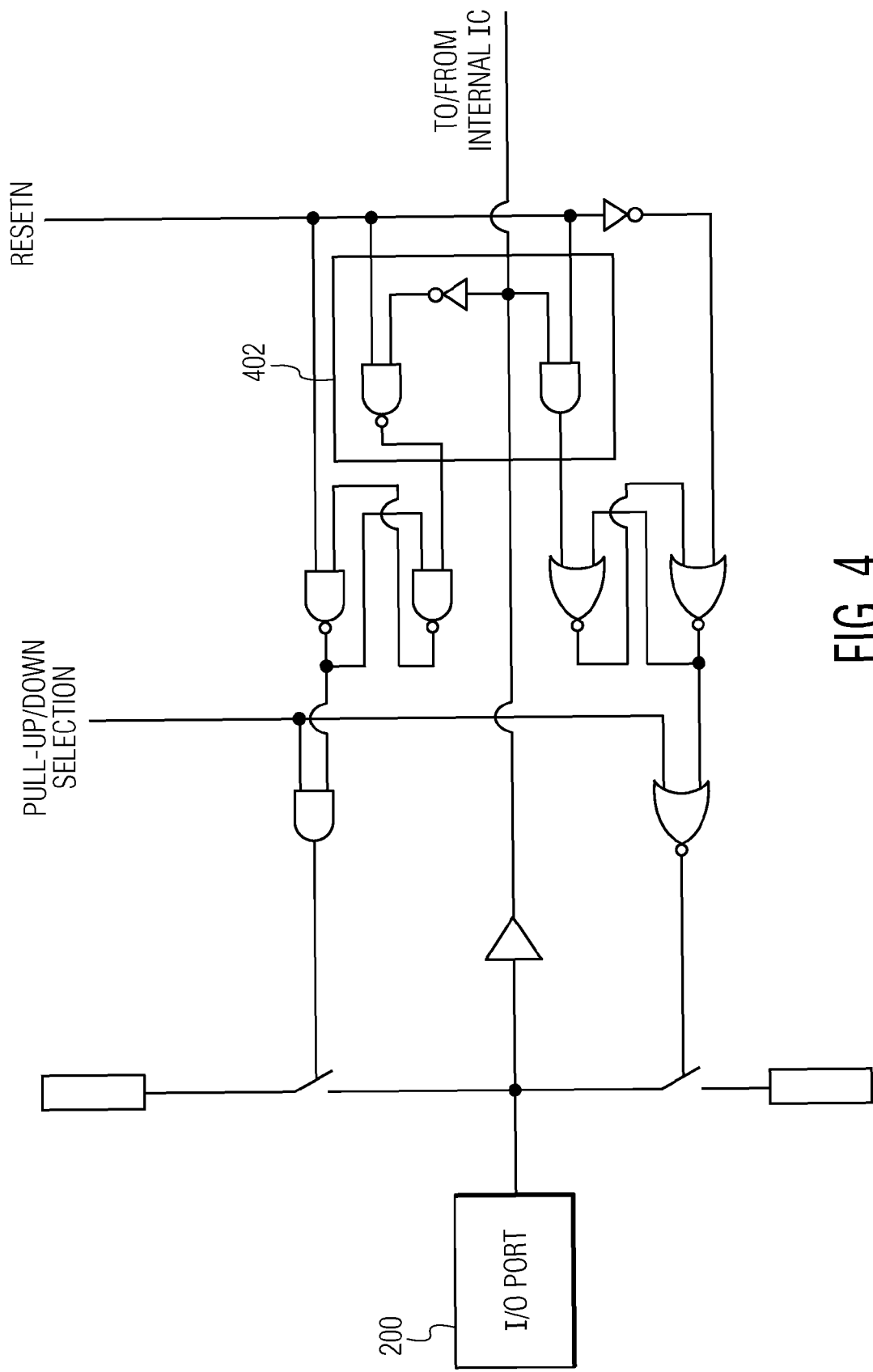
FIG. 4 shows a circuit diagram for an IC die having dynamic pull-ups/downs for I/O pins, according to an example embodiment of the present invention.

FIG. 4 shows a circuit diagram for an IC die having dynamic pull-ups/downs for I/O pins, according to an example embodiment of the present invention. In particular, FIG. 4 is a variation of the circuit of FIG. 1 in which additional logic 402 has been added. SR latches have what is sometimes referred to as restricted conditions on their input signals. If the inputs correspond to the restricted conditions for an SR latch, the output of the latch can be subject to what is sometimes referred to as a race condition. For example, race conditions exist in certain SR latches when both the set and reset inputs are active. This results in an output state that is dependent upon signal propagation delays of the components of the SR latch. These propagation delays can be difficult to ascertain with certainty because they are often dependent upon a number of different circuit properties, some of which may be unknown at the design phase. To compensate for this potential issue, logic 402 prevents both the inputs of the SR latches from being active. Instead, one input is set to an inactive state, while the other remains active. For example, for a situation where S=active and R=active, the input seen due to logic 402 is one of the inputs is inactive and the other is active.

The skilled artisan would recognize that other logic could be implemented to achieve the same or similar functionality. For example, the duel active set/reset could be converted (by logic similar to that of 402) into either S=inactive and R=inactive, S=inactive and R=active, or S=active and R=inactive.

While the present invention has been described above and in the claims that follow, those skilled in the art will recognize that many changes may be made thereto without departing from the spirit and scope of the present invention.

What is claimed is:

1. A method for providing a valid signal level for a pin of an integrated circuit (IC) die, the method comprising:
   responsive to a reset signal, entering a first mode where either a pull-up circuit or a pull-down circuit sets the pin to the valid signal level;
   detecting a new signal level of the pin, the new signal level being a deviation from the valid signal level; and
   responsive to detecting the new signal level, entering a second mode where both the pull-up circuit and the pull-down circuit are disabled until the reset signal is received.

2. The method of claim 1, further comprising:
   selecting either the pull-up circuit or the pull-down circuit for enablement in response to a pull-up/pull-down signal.

3. The method of claim 1, further comprising:
   implementing the first mode and the second mode with a first set-reset (SR) latch having a set input and a reset input, wherein the reset signal is connected to either the set input or the reset input and a signal indicative of detecting the new signal level is connected to either the set input or the reset input.

4. The method of claim 1, further comprising:
   disabling, in the first mode, either the pull-up circuit or the pull-down circuit.

5. The method of claim 1, further comprising:
   disabling, in the second mode, either the pull-up circuit or the pull-down circuit.

6. The method of claim 1, further comprising:
   selecting either the pull-up circuit or the pull-down circuit for enablement in response to a pull-up/pull-down signal that is responsive to a memory element within the IC die.

7. The method of claim 1, wherein either the pull-up circuit or the pull-down circuit includes a resistor tied to the valid signal level, the valid signal level being either a high level or a low level, respectively.

8. A circuit for providing a valid signal level for a pin of an integrated circuit (IC) die, the circuit comprising:
   a pull-up circuit and a pull-down circuit that, when enabled, set the pin to the valid signal level in a reciprocal manner; and
   an enabling circuit that enables either the pull-up circuit or the pull-down circuit in response to a reset signal, and disables both the pull-up circuit and the pull-down circuit in response to a new signal level at the pin until the reset signal is received.

9. The circuit of claim 8, wherein either the pull-up circuit or the pull-down circuit includes a resistor tied to the valid signal level, the valid signal level being either a high level or a low level, respectively.

10. The circuit of claim 8, wherein the enabling circuit further comprises:
    a first set-reset (SR) latch having a set input connected to a signal indicative of a current signal level of the pin and a reset input connected to the reset signal.

11. The circuit of claim 10, wherein the enabling circuit further comprises:
    a second SR latch having a set input connected to a signal indicative of a current signal level of the pin and a reset input connected to the reset signal, wherein the first and second SR latches enable a pull-up resistor and a pull-down resistor in a reciprocal manner.

12. The circuit of claim 8, wherein either the pull-up circuit or the pull-down circuit further comprises:
a resistor and a switch that are in series.

13. The circuit of claim 8, further comprising:
a register for storing a setting that is used to select either the pull-up circuit or the pull-down circuit by indicating either a pull-up or a pull-down setting.

14. A system comprising:
an integrated circuit (IC) die having a pin for connecting signals external to the IC die with signals internal to the IC die;
a pull-up circuit and a pull-down circuit that, when enabled, set the pin to a valid signal level in a reciprocal manner; and
an enabling circuit that enables either the pull-up circuit or the pull-down circuit in response to a reset signal, and disables both the pull-up circuit and the pull-down circuit in response to the pin changing from the valid signal level until the reset signal is received.

15. The system of claim 14, wherein either the pull-up circuit or the pull-down circuit further comprises:
a resistor tied to the valid signal level, the valid signal level being either a high level or a low level, respectively.

16. The system of claim 14, wherein the enabling circuit further comprises:
a first set-reset (SR) latch having a set input connected to a signal indicative of a current signal level of the pin and a reset input connected to the reset signal.

17. The system of claim 16, wherein the enabling circuit further comprises:
a second SR latch having a set input connected to a signal indicative of a current signal level of the pin and a reset input connected to the reset signal, wherein the first and second SR latches enable a pull-up resistor and a pull-down resistor in a reciprocal manner.

18. The system of claim 14, wherein either the pull-up circuit or the pull-down circuit further comprises:
a resistor and a switch that are in series.

19. The system of claim 14, further comprising:
a register for storing a setting that is used to select either the pull-up circuit or the pull-down circuit by indicating either a pull-up or a pull-down setting.

20. The system of claim 18, further comprising:
logic to prevent the first SR latch and the second SR latch from entering a restricted condition.

* * * * *